United States Patent
Wang et al.

(10) Patent No.: US 11,644,704 B2
(45) Date of Patent: May 9, 2023

(54) DISPLAY SUBSTRATE, METHOD OF FABRICATING THE SAME, AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Guohui Wang, Beijing (CN); Tianma Li, Beijing (CN); Liang Li, Beijing (CN); Bin Ji, Beijing (CN); Yicai Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/514,446

(22) Filed: Oct. 29, 2021

(65) Prior Publication Data

US 2022/0299809 A1 Sep. 22, 2022

(30) Foreign Application Priority Data

Mar. 18, 2021 (CN) .......................... 202110291403.6

(51) Int. Cl.
*G02F 1/1333* (2006.01)
*G02F 1/1345* (2006.01)
*G02F 1/1362* (2006.01)
*G02F 1/1368* (2006.01)
*H05K 1/18* (2006.01)

(52) U.S. Cl.
CPC .... *G02F 1/133382* (2013.01); *G02F 1/13452* (2013.01); *G02F 1/13454* (2013.01); *G02F 1/1368* (2013.01); *G02F 1/136222* (2021.01); *G02F 1/136286* (2013.01); *H05K 1/189* (2013.01); *H05K 2201/10136* (2013.01)

(58) Field of Classification Search
CPC ......... G02F 1/133382; G02F 1/133509; G02F 1/133512; G02F 1/133602; G02F 1/13452–13458
See application file for complete search history.

(56) References Cited

U.S. PATENT DOCUMENTS 8,416,162 B2 * 4/2013 Lee ..................... G02F 1/13452
345/82
10,943,961 B2 * 3/2021 Kim ..................... H01L 51/5253

FOREIGN PATENT DOCUMENTS

KR 10-0757782 * 9/2007

* cited by examiner

*Primary Examiner* — Dung T Nguyen
(74) *Attorney, Agent, or Firm* — Houtteman Law LLC

(57) ABSTRACT

The disclosure provides a display substrate and a method of fabricating the same, and a display panel. The display substrate includes: a substrate; a transistor structure on the substrate; a flexible circuit board having one end coupled to the transistor structure, and the other end capable of being bent to a side of the substrate away from the transistor structure; and a blocking conductive layer on the flexible circuit board and configured to block an interference electric field in an external environment from affecting the display substrate.

18 Claims, 4 Drawing Sheets

DISPLAY SUBSTRATE, METHOD OF FABRICATING THE SAME, AND DISPLAY PANEL

CROSS-REFERENCE TO RELATED APPLICATION

This application claims priority to Chinese Patent Application No. 202110291403.6, filed on Mar. 18, 2021, the contents of which are incorporated herein by reference in the entirety.

TECHNICAL FIELD

The present disclosure belongs to the field of display technology, and particularly relates to a display substrate and a method of fabricating the same, and a display panel.

BACKGROUND

With the development of display technologies, the performance of display devices has been continuously improved and the application range of display devices has been continuously expanded. Liquid crystal display devices and organic light emitting diode display devices are widely-used types of display devices.

With regard to the liquid crystal display device, the deflection of the liquid crystal molecules in the liquid crystal layer is driven through the driving electric field produced by the driving electrode to realize the display of the liquid crystal display device. However, the driving electric field is easily affected by other signals, thereby adversely affecting the display effect of the liquid crystal display device.

SUMMARY

In an aspect, embodiments of the present disclosure provide a display substrate, including: a substrate; a transistor structure on the substrate; a flexible circuit board having one end coupled to the transistor structure, and the other end capable of being bent to a side of the substrate away from the transistor structure; and a blocking conductive layer on the flexible circuit board and configured to block an interference electric field in an external environment from affecting the display substrate.

In some embodiments, the display substrate further includes a conductive wire structure on a side of the transistor structure away from the substrate. The blocking conductive layer is on a first surface of the flexible circuit board which is a surface of the flexible circuit board away from the transistor structure, and the blocking conductive layer covers at least a portion of the conductive wire structure.

In some embodiments, the blocking conductive layer includes a black conductive layer, a black conductive adhesive and an insulation layer which are sequentially stacked, and the insulation layer separates and electrically insulates the black conductive adhesive and the black conductive layer from the flexible circuit board.

In some embodiments, the display substrate further includes a heat dissipation layer on a second surface of the flexible circuit board, which is a surface of the flexible circuit board opposite to the first surface of the flexible circuit board.

In some embodiments, a first portion of the second surface of the flexible circuit board is coupled to the transistor structure, and the heat dissipation layer covers a second portion of the second surface of the flexible circuit board that is different from the first portion.

In some embodiments, the heat dissipation layer further covers at least a portion of the transistor structure.

In some embodiments, the heat dissipation layer includes a first insulation layer, a thermal conductive adhesive layer, and a second insulation layer which are sequentially stacked.

In some embodiments, the blocking conductive layer and the heat dissipation layer have a one-piece structure.

In some embodiments, the display substrate further includes a chip structure on a side of the transistor structure away from the substrate and between the transistor structure and the blocking conductive layer in a vertical direction.

In some embodiments, the blocking conductive layer is a black conductive tape with an insulation layer, which is attached to the first surface of the flexible circuit board and electrically insulated from the flexible circuit board.

In an aspect, embodiments of the present disclosure provide a display panel, including: the display substrate described above; and a backlight module on a side of the substrate of the display substrate away from the transistor structure of the display substrate. The flexible circuit board of the display substrate is bent from the display substrate to a side of the backlight module away from the display substrate, and the blocking conductive layer of the display substrate is bent from the display substrate to the side of the backlight module away from the display substrate.

In some embodiments, the display panel further includes a color filter substrate on a side of the transistor structure away from the substrate, and the color filter substrate is separated from a chip structure of the display substrate in a horizontal direction.

In some embodiments, the display substrate further includes a heat dissipation layer on the flexible circuit board, and the heat dissipation layer is bent from the display substrate to the side of the backlight module away from the display substrate.

In some embodiments, the display substrate further includes a conductive wire structure on a side of the transistor structure away from the substrate. The blocking conductive layer is on a first surface of the flexible circuit board which is a surface of the flexible circuit board away from the transistor structure, and the blocking conductive layer covers at least a portion of the conductive wire structure.

In some embodiments, the blocking conductive layer includes a black conductive layer, a black conductive adhesive and an insulation layer which are sequentially stacked, and the insulation layer separates and electrically insulates the black conductive adhesive and the black conductive layer from the flexible circuit board.

In some embodiments, the display substrate further includes a heat dissipation layer on a second surface of the flexible circuit board, which is a surface of the flexible circuit board opposite to the first surface of the flexible circuit board.

In some embodiments, a first portion of the second surface of the flexible circuit board is coupled to the transistor structure, and the heat dissipation layer covers a second portion of the second surface of the flexible circuit board that is different from the first portion.

In some embodiments, the heat dissipation layer further covers at least a portion of the transistor structure.

In some embodiments, the heat dissipation layer includes a first insulation layer, a thermal conductive adhesive layer, and a second insulation layer which are sequentially stacked.

In an aspect, embodiments of the present disclosure provide a method of fabricating a display substrate, where the display substrate is the display substrate described above, and the method includes: forming the transistor structure on the substrate; forming the flexible circuit board, where one end of the flexible circuit board is coupled to the transistor structure; and forming the blocking conductive layer on the flexible circuit board.

BRIEF DESCRIPTION OF DRAWINGS

The accompanying drawings, which constitute a part of the specification, are provided for further understanding of the present disclosure, and for explaining the present disclosure together with the following specific implementations, but not intended to limit the present disclosure. In the drawings.

DETAILED DESCRIPTION

Figure 1:
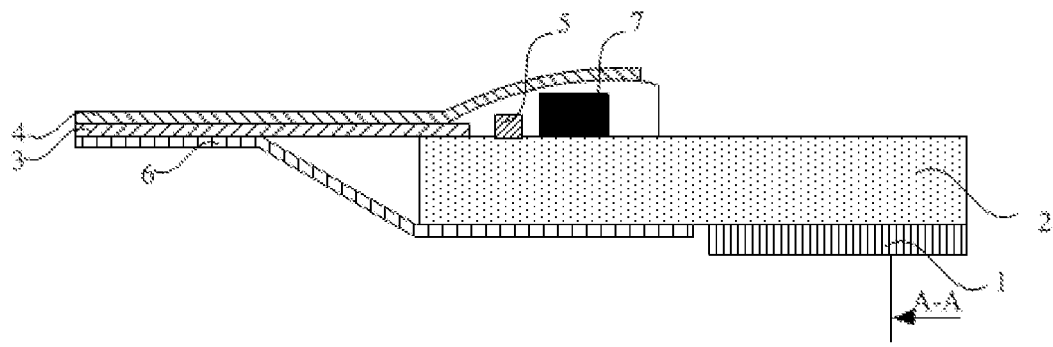
FIG. 1 is a schematic cross-sectional view of a display substrate according to an embodiment of the present disclosure.

To make those skilled in the art better understand the technical solutions of the present disclosure, the present disclosure will be further described in detail below in conjunction with the accompanying drawings and specific implementations.

In the present disclosure, a "patterning process" refers to a step of forming a structure having a specific pattern, which may be a photolithography process including one or more steps of forming a material layer, coating a photoresist, exposing, developing, etching, stripping the photoresist, and the like; of course, the "patterning process" may also be an imprinting process, an inkjet printing process, or other processes.

The present disclosure will be described in more detail below with reference to the accompanying drawings. Like elements are denoted by like reference numerals throughout the drawings. For purposes of clarity, various portions in the drawings are not drawn to scale. Moreover, certain well-known elements may not be shown in the drawings.

Numerous specific details of the present disclosure, such as structures, materials, dimensions, processes and techniques of the components, are set forth in the following description in order to provide a more thorough understanding of the present disclosure. However, as will be understood by those skilled in the art, the present disclosure may be implemented without these specific details.

As shown in FIGS. 1 to 11, an embodiment of the present disclosure provides a display substrate, including: a substrate 1, a transistor structure 2, a flexible circuit board 3 and a blocking conductive layer 4. The transistor structure 2 (TFT) is located on the substrate 1. One end of the flexible circuit board 3 is coupled to the transistor structure 2, and the other end of the flexible circuit board 3 is capable of being bent to a side of the substrate 1 away from the transistor structure 2. The blocking conductive layer 4 is positioned on the flexible circuit board 3 and configured to block an interference electric field in an external environment from affecting the display substrate.

The display substrate of the present embodiment has a display region (e.g., A-A region in FIG. 1) and an edge region surrounding the display region, and a display unit is disposed in the display region to form a display image. One end of the flexible circuit board 3 is coupled to the transistor structure 2 in the edge region, and the flexible circuit board 3 may provide a driving signal to the display unit of the display substrate through the transistor structure 2, so that the display unit can display an image. The blocking conductive layer 4 is disposed on a surface of the flexible circuit board 3, and is configured to block an interference electric field in an external environment from affecting the display substrate.

It should be noted that, the display substrate of the present embodiment may be an array substrate for liquid crystal display or another suitable display substrate. The following description will be given by taking the display substrate as an array substrate for liquid crystal display, which may be applied to a touch liquid crystal display module (TLCM), but is not limited thereto. In a case where the display substrate is an array substrate for liquid crystal display, the display unit of the display substrate is a liquid crystal layer, and liquid crystal molecules in the liquid crystal layer are deflected under the effect of a driving electric field produced through a driving electrode to form a display image.

It is found by the inventor that, in the existing display substrate, the interference electric field in the external environment around the display substrate interferes with the driving electric field generated in the display substrate, thereby affecting the display performance of the display substrate.

In the display substrate of this embodiment, when one end of the flexible circuit board 3 is coupled to the transistor structure 2 and the other end of the flexible circuit board 3 is bent to the side of the substrate 1 away from the transistor structure 2, the blocking conductive layer 4 on the flexible circuit board 3 plays a role of blocking, thereby avoiding the influence of the interference electric field in the external environment on the driving electric field of the display substrate and ensuring the performance of the display substrate.

Figure 3:
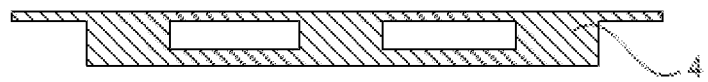
FIG. 3 is a schematic plan view of a blocking conductive layer according to an embodiment of the present disclosure.

In addition, the shape of the blocking conductive layer 4 may match the shape of the flexible circuit board 3, and the number of the blocking conductive layer(s) 4 may also match the number of the flexible circuit board(s) 3, as shown in FIG. 3. It should be noted that the structure of the blocking conductive layer 4 is not limited to the above structure, and may be another suitable structure.

In some embodiments, the display substrate further includes a conductive wire structure 5 on a side of the transistor structure 2 away from the substrate 1. The blocking conductive layer 4 is on a first surface of the flexible circuit board 3 and covers at least a portion of the conductive wire structure 5, and the first surface is a surface of the flexible circuit board 3 away from the transistor structure 2.

The conductive wire structure 5 includes various wirings in the edge region of the display substrate, such as data lines, gate lines, etc. A portion of the blocking conductive layer 4 coupled to the transistor structure 2 covers the conductive wire structure 5.

Because the blocking conductive layer 4 covers a part of the conductive wire structure, the blocking conductive layer 4 not only can play a role of blocking and protecting the conductive wire structure, thereby avoiding the influence of an external interference electric field on the conductive wire structure 5, but also can release excessive charges on the conductive wire structure 5, thereby avoiding the influence of the interference electric field produced by the charges on the conductive wire structure 5 on the driving electric field.

Figure 2:
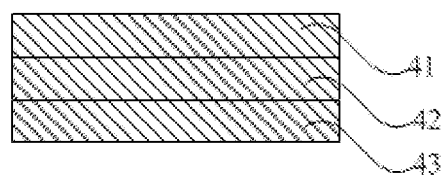
FIG. 2 is a schematic cross-sectional view of a blocking conductive layer according to an embodiment of the present disclosure.

In some embodiments, as shown in FIG. 2, the blocking conductive layer 4 includes a black conductive layer 41 (e.g., a black conductive fabric), a black conductive adhesive 42, and an insulation layer 43 (e.g., a paper liner) stacked sequentially. The insulation layer 43 separates the black conductive adhesive 42 from the flexible circuit board 3 and electrically insulates the black conductive adhesive and the black conductive layer from the flexible circuit board.

That is, the blocking conductive layer 4 includes, sequentially in a direction away from the first surface of the flexible circuit board 3, the insulation layer 43, the black conductive adhesive 42, and the black conductive layer 41. The black conductive adhesive 42 couples the insulation layer 43 and the black conductive layer 41. The insulation layer 43 separates the black conductive adhesive 42 from the flexible circuit board 3, thereby ensuring the signal transmission performance of the flexible circuit board 3. The black conductive layer 41 can ensure the conductivity of the blocking conductive layer 4, thereby ensuring the release of excessive charges on the conductive wire structure 5.

In some embodiments, the display substrate further includes a heat dissipation layer 6 on a second surface of the flexible circuit board 3, which is a surface of the flexible circuit board 3 opposite to the first surface of the flexible circuit board 3.

The flexible circuit board 3 has a heat dissipation layer 6 on its second surface, that is, the heat dissipation layer 6 and the blocking conductive layer 4 are provided on two opposite surfaces of the flexible circuit board 3, respectively.

The flexible circuit board 3 may have an excessively high temperature during signal transmission. When the temperature of the flexible circuit board 3 is too high, the heat dissipation layer 6 can dissipate heat of the flexible circuit board 3 quickly.

Figure 5:
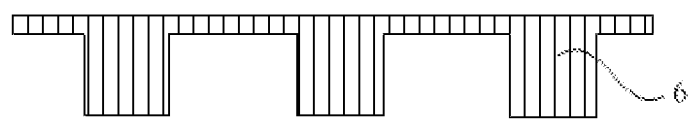
FIG. 5 is a schematic plan view of a heat dissipation layer according to an embodiment of the present disclosure.

In addition, the shape of the heat dissipation layer 6 may match the shape of the flexible circuit board 3, and the number of the heat dissipation layer(s) 6 may also match the number of the flexible circuit board(s) 3, as shown in FIG. 5. It should be noted that, the structure of the heat dissipation layer 6 is not limited to the above structure, and may be another suitable structure.

In some embodiments, a first portion of the second surface of the flexible circuit board 3 is coupled to the transistor structure 2, and the heat dissipation layer 6 covers a second portion of the second surface of the flexible circuit board 3 different from the first portion of the second surface.

In some embodiments, the heat dissipation layer 6 further covers at least a portion of the transistor structure 2.

During the operation of the display substrate, the transistor structure 2 may have an excessively high temperature. When the temperature of the transistor structure 2 is too high, the heat dissipation layer 6 can accelerate the heat dissipation of the transistor structure 2, i.e., quickly dissipate the heat of the transistor structure 2.

Figure 4:
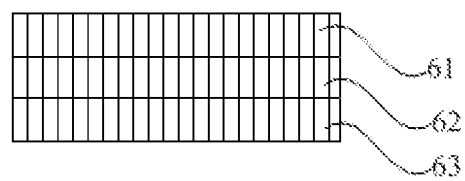
FIG. 4 is a schematic cross-sectional view of a heat dissipation layer according to an embodiment of the present disclosure.

In some embodiments, as shown in FIG. 4, the heat dissipation layer 6 includes a first insulation layer 61 (e.g., a PET film), a thermal conductive adhesive layer 62 (e.g., a thermal conductive adhesive tape), and a second insulation layer 63 (e.g., a PET film) stacked in sequence.

That is, the heat dissipation layer 6 includes, sequentially in a direction away from the second surface of the flexible circuit board 3, the first insulation layer 61, the thermal conductive adhesive layer 62, and the second insulation layer 63. The first insulation layer 61 is configured to insulate the thermal conductive adhesive layer 62 from the flexible circuit board 3 and the transistor structure 2, thereby ensuring the performance of the flexible circuit board 3 and the transistor structure 2. The thermal conductive adhesive layer 62 has a relatively high thermal-conducting property. The second insulation layer 63 ensures insulation between the thermal conductive adhesive layer 62 and other structures in the display substrate.

In some embodiments, the blocking conductive layer 4 and the heat dissipation layer 6 have a one-piece structure.

That is, the blocking conductive layer 4 and the heat dissipation layer 6 may have an integral structure. The integral structure may be folded so that the integral structure covers both surfaces of the flexible circuit board 3. That is, two opposite parts of the folded integral structure are sandwiched with the flexible circuit board 3 to serve as the blocking conductive layer 4 and the heat dissipation layer 6, respectively.

In some embodiments, the display substrate further includes a chip structure 7 on a side of the transistor structure 2 away from the substrate 1, and the chip structure 7 is between the transistor structure 2 and the blocking conductive layer 4 in a vertical direction.

The chip structure 7 may include a display chip and a driving chip (e.g., a TP chip) integrated on the display chip to drive the display unit to display.

Since the chip structure 7 includes at least two chips, the chip structure 7 is prone to an excessively high temperature, which in turn causes an excessively high temperature of the transistor structure 2. By the arrangement of the heat dissipation layer 6, the heat in the chip structure 7 or the transistor structure 2 can be quickly dissipated, thereby avoiding an excessively high temperature of the display substrate and thus improving the user experience.

Figure 6:
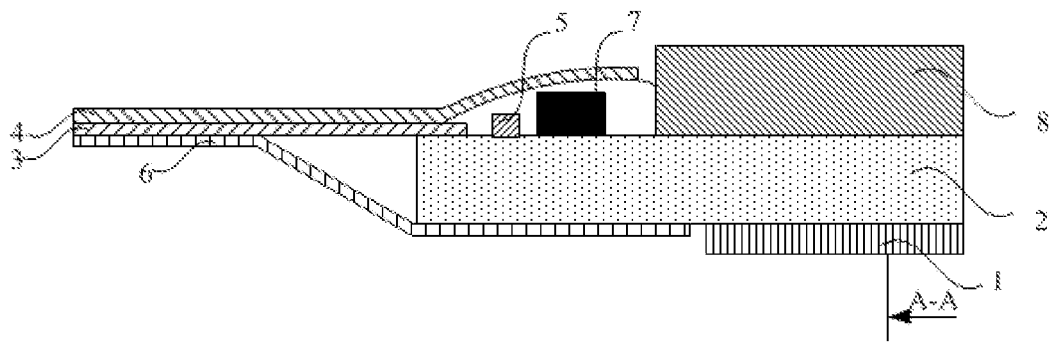
FIG. 6 is a schematic cross-sectional view of a display panel according to an embodiment of the present disclosure.

It should be noted that, as shown in FIG. 6, a display panel including the display substrate further includes a color filter layer 8 located on a side of the transistor structure 2 away from the substrate 1. In a case where the resistance of the color filter layer 8 is relatively high, especially in a case of the color filter layer 8 formed by a high resistance film, it is difficult to release charges on the color filter layer 8, so that an interference electric field (EMI or EMS) is produced. The blocking conductive layer 4 in the display substrate of the present embodiment can avoid the influence of the interference electric field on the transistor structure 2 and the conductive wire structure 5, thereby ensuring the display performance of the display substrate.

As shown in FIGS. 1 to 11, the present embodiment provides a display panel including the display substrate in the above-mentioned embodiments and a backlight module 9. The backlight module 9 is located on a side of the substrate 1 of the display substrate away from the transistor structure 2 of the display substrate, the flexible circuit board 3 of the display substrate is bent from the display substrate to a side of the backlight module 9 away from the display substrate, and the blocking conductive layer 4 of the display substrate is bent from the display substrate to the side of the backlight module 9 away from the display substrate.

Figure 7:
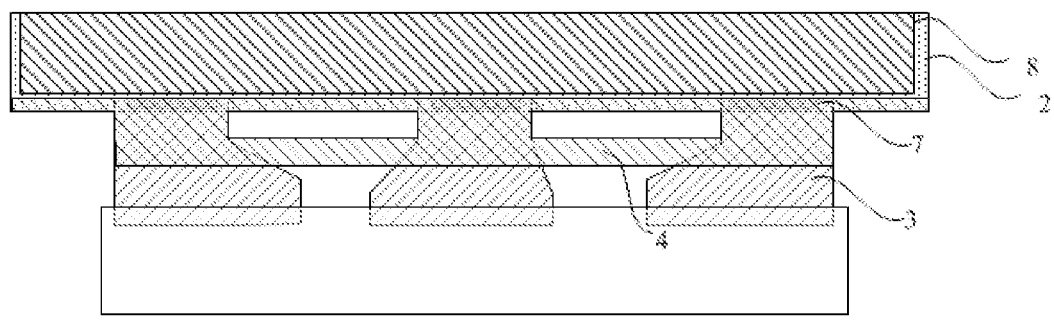
FIG. 7 is a schematic plan view of a display panel according to an embodiment of the present disclosure.
Figure 8:
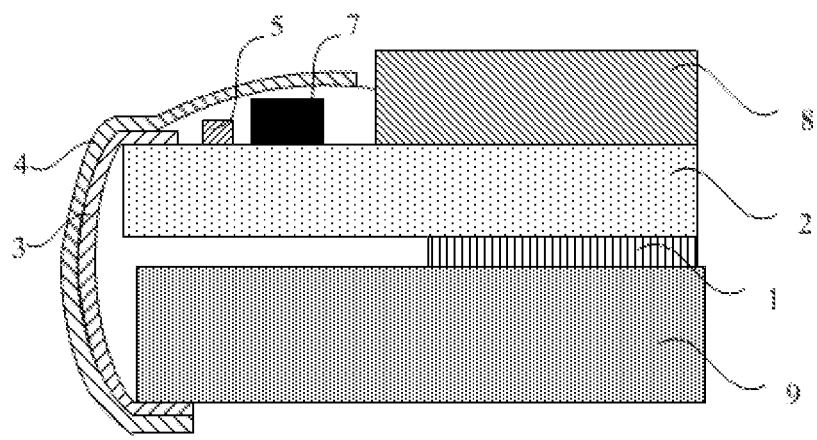
FIG. 8 is a schematic cross-sectional view of a display panel according to an embodiment of the present disclosure.

As shown in FIGS. 7 and 8, the display panel includes the display substrate and a backlight module 9 which are stacked. The backlight module 9 is configured to provide a light source for the display substrate, such that a display image can appear on a side of the display substrate away from the backlight module 9.

The flexible circuit board 3 is coupled to a main board. In order to reduce the edge region of the display panel, the flexible circuit board 3 is bent to the back of the backlight module 9, so that the main board is located on the back of the backlight module 9.

In the display panel of this embodiment, when one end of the flexible circuit board 3 is coupled to the transistor structure 2 and the other end of the flexible circuit board 3 is bent to the side of the substrate 1 away from the transistor structure 2, the blocking conductive layer 4 on the flexible circuit board 3 can play a role of blocking, thereby avoiding the influence of the interference electric field in the external environment on the driving electric field of the display substrate and ensuring the performance of the display substrate.

Meanwhile, as the blocking conductive layer 4 covers a part of the conductive wire structure, the blocking conductive layer 4 not only can block and protect the conductive wire structure, thereby avoiding the influence of an external interference electric field on the conductive wire structure 5, but also can release excessive charges on the conductive wire structure 5, thereby avoiding the influence of the interference electric field produced by the charges on the conductive wire structure 5 on the driving electric field.

Figure 9:
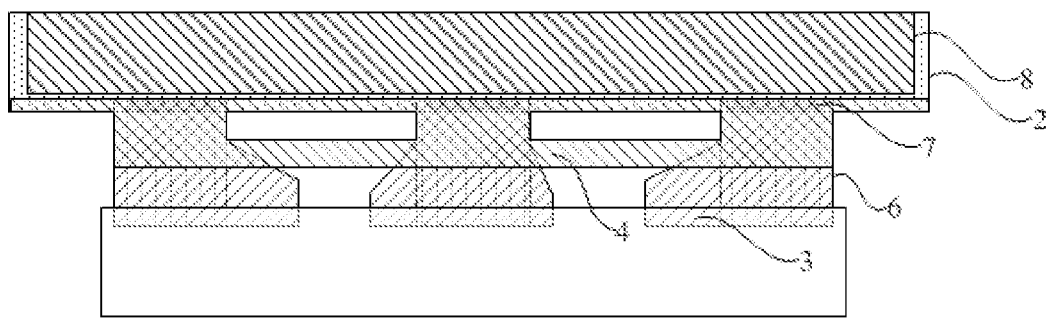
FIG. 9 is a schematic plan view of a display panel according to an embodiment of the present disclosure.
Figure 10:
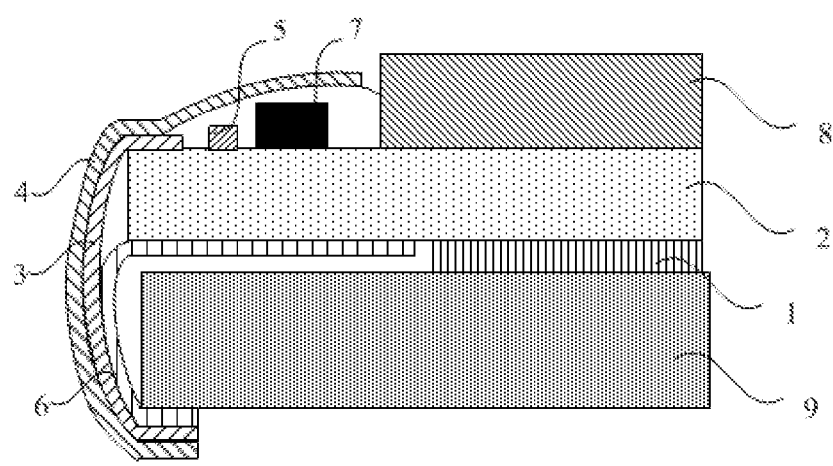
FIG. 10 is a schematic cross-sectional view of a display panel according to an embodiment of the present disclosure.
Figure 11:
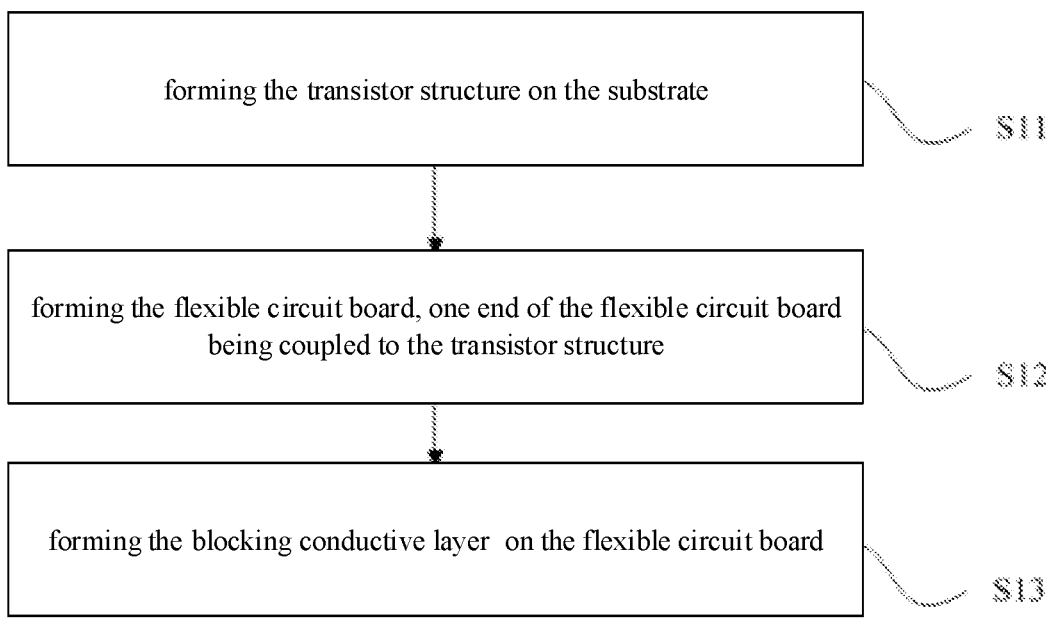
FIG. 11 is a schematic flow chart of a method of fabricating a display substrate according to an embodiment of the present disclosure.

In some embodiments, as shown in FIGS. 9 and 10, the heat dissipation layer 6 of the display substrate is bent from the display substrate to a side of the backlight module 9 away from the display substrate.

The flexible circuit board 3 may have an excessively high temperature during signal transmission. When the temperature of the flexible circuit board 3 is too high, the heat dissipation layer 6 can dissipate heat of the flexible circuit board 3 quickly.

In addition, since the heat dissipation layer 6 covers at least a part of the transistor structure 2, when the temperature of the transistor structure 2 is too high, the heat dissipation layer 6 can accelerate the heat dissipation of the transistor structure 2, i.e., quickly dissipate the heat of the transistor structure 2. Meanwhile, the display panel of the embodiment is a light and thin product and has a low cost.

In some embodiments, as shown in FIG. 6, the display substrate further includes the color filter substrate 8 located on a side of the transistor structure 2 away from the substrate 1, and there is a gap between the color filter substrate 8 and the chip structure 7 of the display substrate.

The color filter substrate 8 may be located in a display region of the display substrate and configured to enable the display substrate to form a color display image.

It should be noted that, the color filter substrate 8 has a relatively high resistance. In particular, for the color filter substrate 8 formed of a high-resistance film, charges on the color filter substrate 8 are hardly released, and thus an interference electric field (EMI or EMS) is produced. The blocking conductive layer 4 in the display substrate of the present embodiment can avoid the influence of the interference electric field on the transistor structure 2 and the conductive wire structure 5, thereby ensuring the display performance of the display substrate.

In addition, a transparent cover plate is further disposed on an upper side of the color filter substrate 8, and the transparent cover plate may be a glass cover plate or another suitable cover plate. The transparent cover plate is attached through transparent adhesive tape which may be OCR optical adhesive or OCA optical adhesive.

Specifically, the display panel may be any product or component with a display function, such as a liquid crystal display panel for an in-cell TLCM, an electronic paper, a mobile phone, a tablet computer, a television, a display, a notebook computer, a digital photo frame, a navigator, or the like.

As shown in FIGS. 1 to 11, the present embodiment provides a method of fabricating a display substrate, which includes steps S11 to S13 based on the display substrate of the above-mentioned embodiments.

In step S11, the transistor structure 2 is formed on the substrate 1.

The display substrate of this embodiment has a display region and an edge region surrounding the display region, and the transistor structure 2 is at least partially located in the edge region.

In step S12, the flexible circuit board 3 is formed, with one end of the flexible circuit board 3 being coupled to the transistor structure 2.

One end of the flexible circuit board 3 is coupled to the transistor structure 2 in the edge region, and the flexible circuit board 3 may provide a driving signal to a display unit of the display substrate through the transistor structure 2, so that the display unit can display an image.

In step S13, the blocking conductive layer 4 is formed on the flexible circuit board 3.

Specifically, the blocking conductive layer 4 is attached to the flexible circuit board 3 by a specific method. The blocking conductive layer 4 is disposed on a surface of the flexible circuit board 3 and configured to block the interference electric field in the external environment from affecting the display substrate, and the attachment of the blocking conductive layer 4 does not affect a subsequent attachment of the cover plate.

In the method of fabricating the display substrate according to the embodiment, in a case where one end of the flexible circuit board 3 is coupled to the transistor structure 2 and the other end of the flexible circuit board is capable of being bent to the side of the substrate 1 away from the transistor structure 2, the blocking conductive layer 4 on the flexible circuit board 3 can play a role of blocking, thereby avoiding the influence of an interference electric field in an external environment on a driving electric field of the display substrate, and ensuring the performance of the display substrate.

Further, step S13 further includes forming the heat dissipation layer 6 on the flexible circuit board 3.

Specifically, the heat dissipation layer 6 is attached to the flexible circuit board 3 by a specific method, and the attachment of the heat dissipation layer 6 does not affect a subsequent attachment of the cover plate. The flexible circuit board 3 may have an excessively high temperature during signal transmission. When the temperature of the flexible circuit board 3 is too high, the heat dissipation layer 6 can dissipate heat of the flexible circuit board 3 quickly.

It should be noted that, relational terms herein such as first, second, and the like are used solely to distinguish one entity or action from another entity or action, but do not necessarily require or imply any actual relationship or order between such entities or actions. Also, the terms "include", "including", or any other variation thereof, are intended to cover a non-exclusive inclusion, such that a(an) process, method, object, or apparatus including a list of elements does not include only those elements but may further include other elements not expressly listed or further include elements inherent to such process, method, object, or apparatus. Without further limitation, an element defined by the phrase "including an . . . " does not exclude the presence of other identical elements in the process, method, object, or apparatus that includes the element.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A display substrate, comprising:
   a substrate;
   a transistor structure on the substrate;
   a flexible circuit board having one end coupled to the transistor structure, and another end capable of being bent to a side of the substrate away from the transistor structure; and
   a blocking conductive layer on the flexible circuit board and configured to block an interference electric field in an external environment from affecting the display substrate,
   wherein the blocking conductive layer is on a first surface of the flexible circuit board which is a surface of the flexible circuit board away from the transistor structure, and
   the display substrate further comprises: a heat dissipation layer on a second surface of the flexible circuit board, the second surface being a surface of the flexible circuit board opposite to the first surface of the flexible circuit board.

2. The display substrate of claim 1, further comprising:
   a conductive wire structure on a side of the transistor structure away from the substrate,
   wherein the blocking conductive layer covers at least a portion of the conductive wire structure.

3. The display substrate of claim 2, wherein the blocking conductive layer is a black conductive tape with an insulation layer, and attached to the first surface of the flexible circuit board and electrically insulated from the flexible circuit board.

4. The display substrate of claim 1, wherein the blocking conductive layer comprises a black conductive layer, a black conductive adhesive and an insulation layer which are sequentially stacked, and the insulation layer separates and electrically insulates the black conductive adhesive and the black conductive layer from the flexible circuit board.

5. The display substrate of claim 1, wherein a first portion of the second surface of the flexible circuit board is coupled to the transistor structure, and the heat dissipation layer covers a second portion of the second surface of the flexible circuit board that is different from the first portion.

6. The display substrate of claim 5, wherein the heat dissipation layer further covers at least a portion of the transistor structure.

7. The display substrate of claim 5, wherein the heat dissipation layer comprises a first insulation layer, a thermal conductive adhesive layer, and a second insulation layer which are sequentially stacked.

8. The display substrate of claim 1, wherein the blocking conductive layer and the heat dissipation layer have a one-piece structure.

9. The display substrate of claim 1, further comprising:
   a chip structure on a side of the transistor structure away from the substrate, and between the transistor structure and the blocking conductive layer in a vertical direction.

10. A display panel, comprising:
    the display substrate of claim 1; and
    a backlight module on a side of the substrate of the display substrate away from the transistor structure of the display substrate, wherein the flexible circuit board of the display substrate is bent from the display substrate to a side of the backlight module away from the display substrate, and the blocking conductive layer of the display substrate is bent from the display substrate to the side of the backlight module away from the display substrate.

11. The display panel of claim 10, further comprising:
    a color filter substrate on a side of the transistor structure away from the substrate, and separated from a chip structure of the display substrate in a horizontal direction.

12. The display panel of claim 10, wherein the heat dissipation layer is bent from the display substrate to the side of the backlight module away from the display substrate.

13. The display panel of claim 10, wherein the display substrate further comprises a conductive wire structure on a side of the transistor structure away from the substrate,
    wherein the blocking conductive layer covers at least a portion of the conductive wire structure.

14. The display panel of claim 13, wherein a first portion of the second surface of the flexible circuit board is coupled to the transistor structure, and the heat dissipation layer covers a second portion of the second surface of the flexible circuit board that is different from the first portion.

15. The display panel of claim 14, wherein the heat dissipation layer further covers at least a portion of the transistor structure.

16. The display panel of claim 14, wherein the heat dissipation layer comprises a first insulation layer, a thermal conductive adhesive layer, and a second insulation layer which are sequentially stacked.

17. The display panel of claim 10, wherein the blocking conductive layer comprises a black conductive layer, a black conductive adhesive and an insulation layer which are sequentially stacked, and the insulation layer separates and electrically insulates the black conductive adhesive and the black conductive layer from the flexible circuit board.

18. A method of fabricating a display substrate, the display substrate being the display substrate of claim 1, the method comprising:
    forming the transistor structure on the substrate;
    forming the flexible circuit board, one end of the flexible circuit board being coupled to the transistor structure; and
    forming the blocking conductive layer on the flexible circuit board.

* * * * *